(12) United States Patent
Keller et al.

(10) Patent No.: US 7,028,283 B1
(45) Date of Patent: Apr. 11, 2006

(54) METHOD OF USING A HARDWARE LIBRARY IN A PROGRAMMABLE LOGIC DEVICE

(75) Inventors: Eric R. Keller, Boulder, CO (US); Philip B. James-Roxby, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 61 days.

(21) Appl. No.: 10/354,518

(22) Filed: Jan. 30, 2003

(51) Int. Cl.
*G06F 17/50* (2006.01)
(52) U.S. Cl. ............... 716/18; 716/16; 716/17
(58) Field of Classification Search ............... 716/18, 716/17, 16
See application file for complete search history.

(56) References Cited

U.S. PATENT DOCUMENTS

| | | | | |
|---|---|---|---|---|
| 5,457,408 A * | 10/1995 | Leung | ............... | 326/38 |
| 6,081,473 A * | 6/2000 | Agrawal et al. | ....... | 365/230.01 |
| 6,163,168 A * | 12/2000 | Nguyen et al. | ............... | 326/41 |
| 6,523,101 B1* | 2/2003 | Nakata | ............... | 711/169 |
| 6,772,230 B1* | 8/2004 | Chen et al. | ............... | 710/8 |
| 6,816,814 B1* | 11/2004 | Ebert et al. | ............... | 702/182 |

OTHER PUBLICATIONS

U.S. Appl. No. 10/354,493, filed Jan. 30, 2003, Keller et al.

* cited by examiner

*Primary Examiner*—Stacy A. Whitmore
*Assistant Examiner*—Sun James Lin
(74) *Attorney, Agent, or Firm*—John J. King

(57) ABSTRACT

A method of using hardware libraries in a programmable logic device is disclosed. In particular, the method generally comprises steps of detecting a hardware library when compiling a software program for the programmable logic device; and accessing hardware module information stored in the hardware library; inserting the hardware module information of the hardware library into a reference platform.

22 Claims, 5 Drawing Sheets

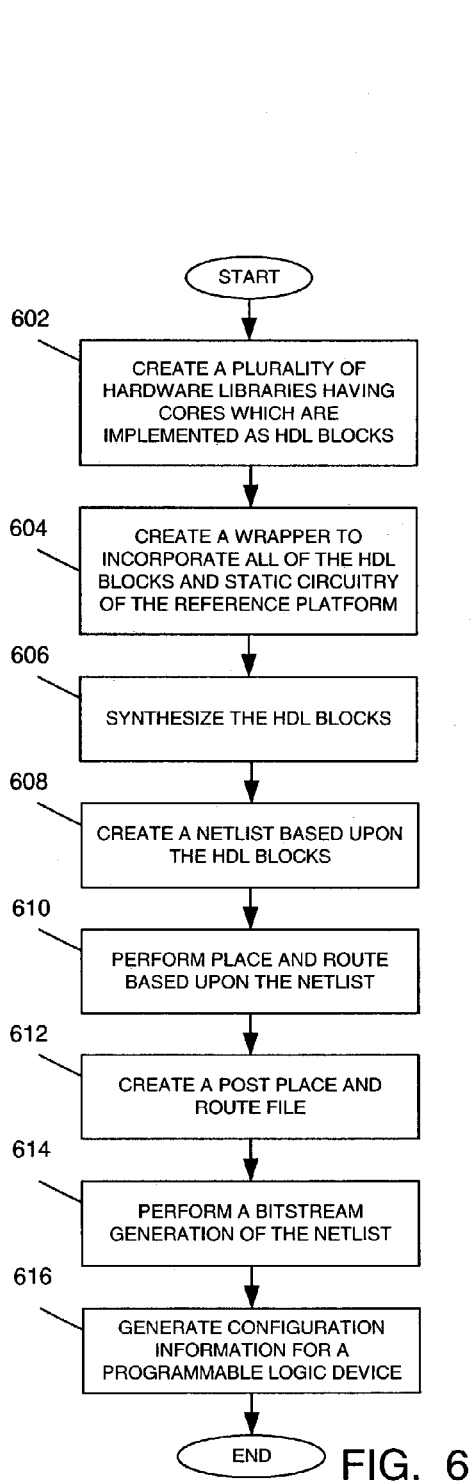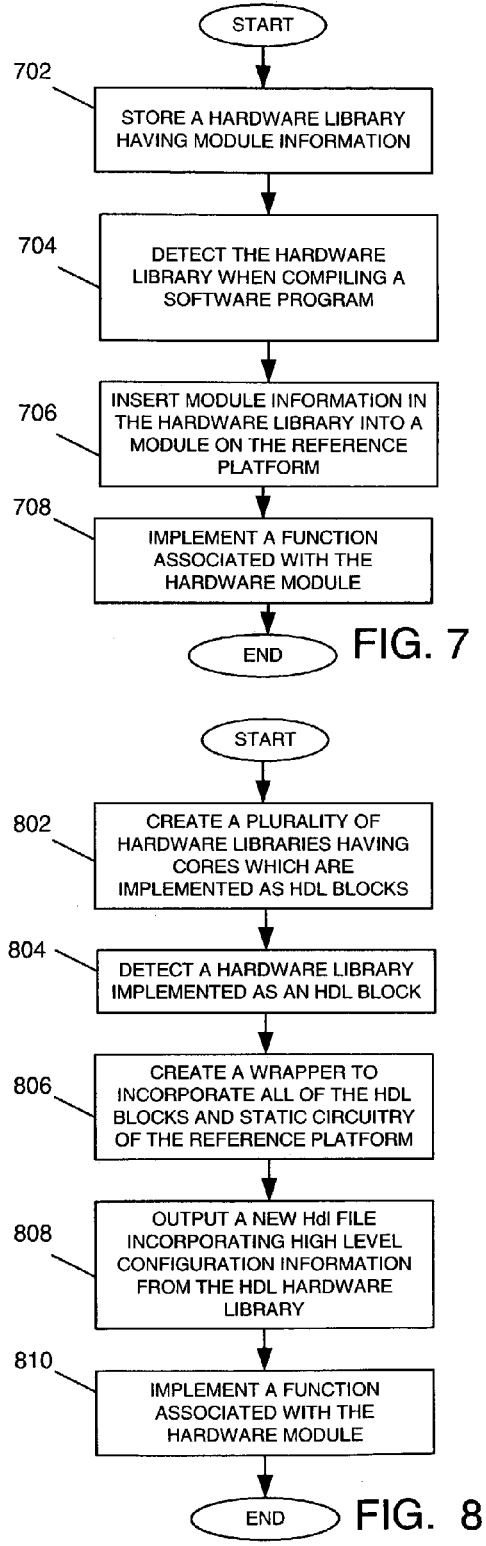
FIG. 6
FIG. 7
FIG. 8

METHOD OF USING A HARDWARE LIBRARY IN A PROGRAMMABLE LOGIC DEVICE

FIELD OF THE INVENTION

This invention relates generally to electronic devices, and in particular, to a method of using a hardware library in a programmable logic device.

BACKGROUND OF THE INVENTION

Programmable logic devices, such as field programmable gate arrays (FPGA), enable the fast, efficient, and low-cost implementation of circuits in electronic devices. Programmable logic devices generally include logic elements which can be configured to implement logic functions. A portion of the programmable logic device can be partitioned to implement a plurality of hardware modules. That is, these hardware modules can be programmed as needed to implement a desired function of the programmable logic device.

In software, program code is written that makes use of external functions and data structures. These functions are contained in object or library files. When the program is compiled, a linking step pulls together the necessary object/library files and includes their functionality into the final executable. There are standard formats such as ELF and COFF which exist to define the structure of the object/library files. When this code gets compiled, the compiler sees that a function is an external reference, and leaves it up to the linker. The linker will search the list of library/object files to find a function with the correct signature, and it will insert the code into the executable.

Writing software that interacts with configurable hardware either requires (i) extra software code to set up the configurable logic, or (ii) extra steps to define the functionality of the configurable logic. In particular, the first methodology of enabling software to interact with configurable hardware includes adding extra code to the software program that loads in a required hardware module. The disadvantage of this methodology is that it requires extra code and creates a more complex interface.

The second methodology includes creating a fixed platform in advance, and writing the software program to use that platform. That is, all of the hardware modules are fixed in advance of the software. Instead of the software code implicitly defining the required hardware modules, an engineer has to explicitly specify the modules to put in hardware. There is currently no method of implementing hardware libraries in a software design in simple or efficient manner.

Accordingly, there is a need for an improved method of and apparatus for using hardware libraries in a programmable logic device.

SUMMARY OF THE INVENTION

A method of using hardware libraries in a programmable logic device is disclosed. In particular, the method generally comprises steps of detecting a hardware library when compiling a software program; and accessing hardware module information stored in the hardware library; inserting the hardware module information of the hardware library into a reference platform.

BRIEF DESCRIPTION OF THE DRAWINGS

FIG. 6 a flowchart showing a method of generating configuration information according to an embodiment of the present invention;

FIG. 7 a flowchart showing a method of inserting module information of a hardware file according to an embodiment of the present invention;

FIG. 8 a flowchart showing a method of creating an HDL file having high level configuration information of a hardware module according to an embodiment of the present invention;

DETAILED DESCRIPTION OF THE DRAWINGS

The present invention relates to a method of writing software in a manner that handles hardware modules in a simple and efficient manner. An embodiment of the present invention describes the ability to create object/library files that instead of containing software, contains configuration information. When the program is compiled, the linker will look at the object/library file type, which could be found for example in the header. If the file is a software file, the compiler treats the file in a conventional manner. If the compiler sees that the object/library file is hardware file, then it will do bitstream manipulation to place the module definition contained in that library into a module in the reference platform. However, the method of an embodiment of the present invention could be applied at any stage of the design flow. That is, information related to a configuration of a hardware module could be provided in a newly generated HDL file, a netlist, a post place and route file, etc. The information related to a configuration of a hardware module could then be included in a reference platform based upon an HDL file, a netlist, etc. according to an embodiment of the present invention.

Hardware module libraries would preferably be created with a modular design flow where all logic and routing would be completely contained within a given area. That is, the modules would not require any resources that are used in another module or by the static infrastructure. Further, the method of an embodiment of the present invention facilitates platform based design which has some static infrastructure and some configurable modules. By modifying a compiler's linking step, the hardware modules can be linked in based on the user's program. This means that a software writer does not need to add extra code to load the hardware and does not need to create a fixed platform instance.

Figure 1:
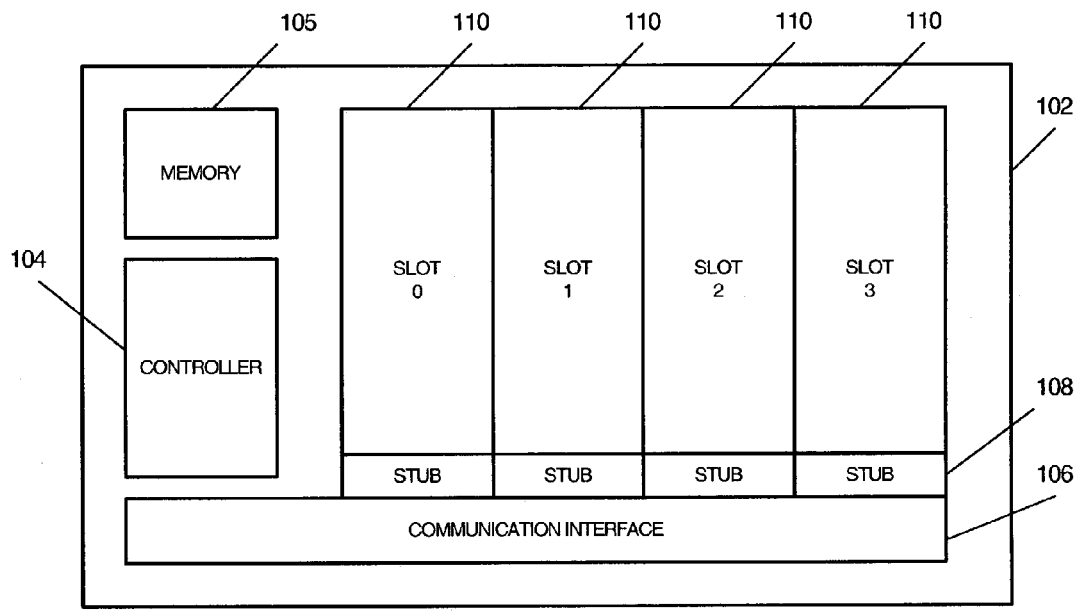
FIG. 1 is a block diagram of a reference platform employing the method and apparatus of an embodiment of the present invention.

Turning now to the figures, the block diagram of FIG. 1 shows a reference platform employing the method of an embodiment of the present invention. In particular, a reference platform 102 comprises a controller 104 and a memory 105. Although the memory 105 is shown as a part of the programmable logic device, the memory 105 could be employed separately from the programmable logic device in a host device incorporating the programmable logic device. The reference platform further comprises a communication interface 106 coupled to a plurality of stubs 108. The communication interface generally includes routing logic, while the stubs 108 generally include bus decoding logic. The communication interface and stubs are preferably programmable logic, but remain static circuits for a given platform. Finally, a plurality of user configurable slots 110 enable the programmable logic device to be employed having user definable hardware modules. These user definable hardware modules are based upon hardware libraries loaded in the reference platform according to the method of an embodiment of the present invention.

Figure 2:
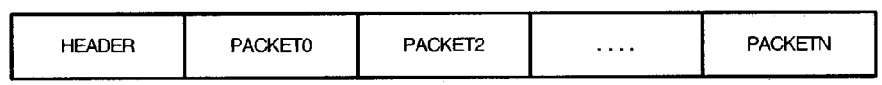
FIG. 2 is a packet diagram of bitstreams having configuration information according to an embodiment of the present invention.
Figure 3:
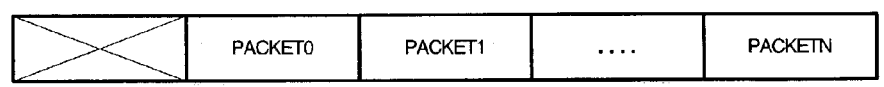
FIG. 3 is a packet diagram of bitstreams having configuration information without a header according to an embodiment of the present invention.

Turning now to FIG. 2, a packet diagram of bitstreams having configuration information according to an embodiment of the present invention is shown. The packets comprise binary data containing information about how to configure the configurable logic device, and may be partial or full bitstream. In contrast, the packet diagram of FIG. 3 comprises configuration information without a header information. That is, the packets of the packet diagram of FIG. 3 include only raw configuration data.

Figure 4:
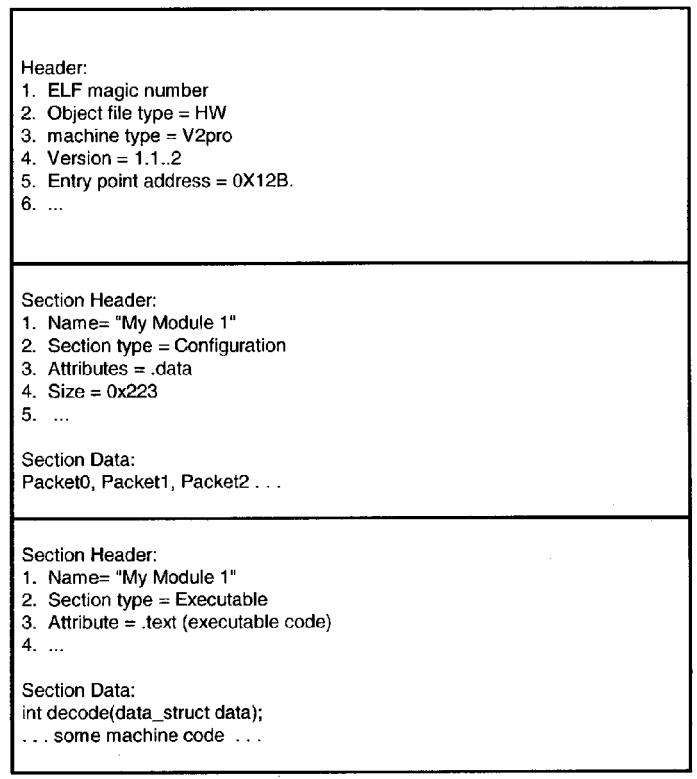
FIG. 4 is an example of a hardware library according to an embodiment of the present invention.

Turning now to FIG. 4, an example of a hardware library according to an embodiment of the present invention is shown. The hardware library of FIG. 4 is a part of a library based on of the ELF format, which breaks the library up into sections. The first section is a header for the library detailing information such as object file type (e.g. hardware (HW) or software (SW).) The header also lists each section in the library and where it is located. Each section has a header and some data. For a hardware module of an embodiment of the present invention, the data would be raw configuration data. For an HDL file, the section data would include HDL code. The hardware module would also preferably have a software section detailing the drivers. For example, FIG. 4 gives an illustrative function declaration for a function "decode( )", that would be inserted in the application program. In contrast, software libraries would contain machine code.

Figure 5:
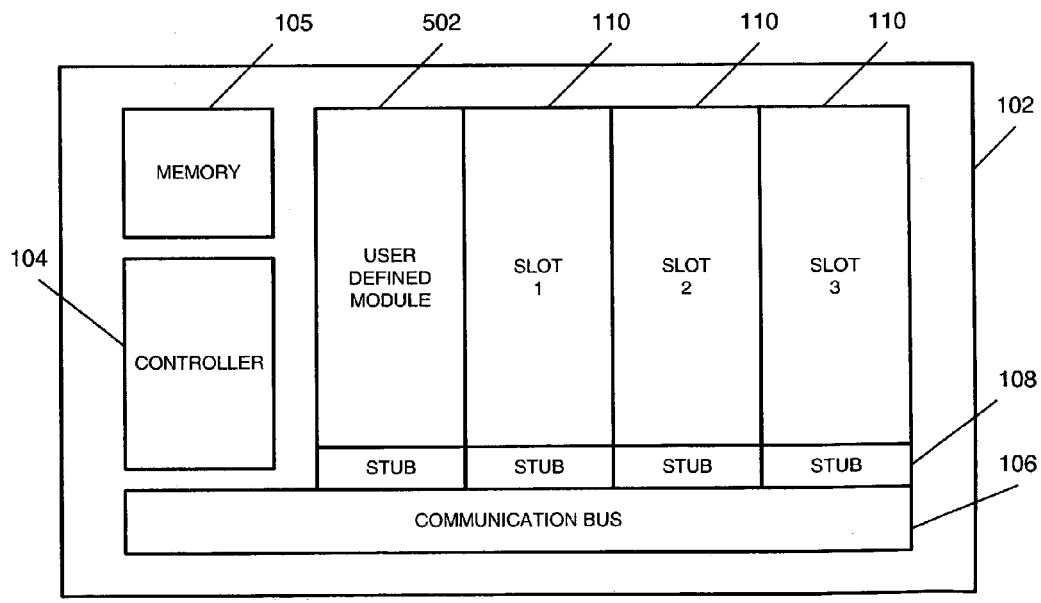
FIG. 5 is a block diagram of a reference platform employing a hardware module according to the method and apparatus of an embodiment of the present invention.

Turning now to FIG. 5, a block diagram of a reference platform employing a hardware module according to an embodiment of the present invention is shown. The reference platform is the same as that of FIG. 1 except that it includes a user definable module 502 in slot 0, where the user definable module is a hardware module from a hardware library. FIG. 5 is created by first determining that the object file type of library accessed is a hardware type and next calling an initialize module function which creates an instantiation of the user definable module 502 in an instance of the reference platform (see FIG. 12 steps 1212–1218). Although a single user definable module is shown, other user definable modules could be employed in other open slots according to an embodiment of the present invention.

Turning now to FIG. 6, a flowchart shows a method of generating configuration information for programmable logic device according to an embodiment of the present invention. In particular, a plurality of hardware files are created having cores which are implemented as HDL blocks. A wrapper is created to incorporate the HDL blocks and static circuitry of a reference platform at a step 604. The HDL blocks are then synthesized at a step 606, and a netlist is created based upon each HDL block at a step 608. Place and route is then performed based upon the netlist at a step 610, and a place and route file is then created at a step 612. A bit stream manipulation is then performed on the netlist at a step 614. Finally, configuration information is generated for the programmable logic device at a step 616.

Turning now to FIG. 7, a flowchart shows a method of inserting module information of a hardware library file according to an embodiment of the present invention. In particular, a hardware library having module information is stored at a step 702. The module information generally provides the layout of the hardware module in configurable logic. For example, the module information could range from high level configuration information of an HDL file to bitstream configuration information at the bitstream level. The hardware library is detected when a software program is compiled at a step 704. The module information in the hardware library is converted into a hardware module on reference platform a step 706. Finally, a function associated with the hardware module is implemented at a step 708. That is, depending upon the format of the hardware library file (e.g. HDL, netlist, etc.), a file is created in the same format incorporating the configuration information of the hardware library.

Turning now to FIG. 8, a flowchart shows a method of including module information of an HDL hardware library file in a programmable logic device according to an embodiment of the present invention. In particular, a plurality of hardware library files are created having cores which are implemented as HDL blocks at a step 802. A hardware library implemented as an HDL block is detected at a step 804. A wrapper is created to incorporate all of the HDL blocks and static circuitry of the reference platform at a step 806. A new HDL file incorporating high-level configuration information from the HDL hardware library file is a output at a step 808.

Finally, a function associated with the hardware module is implemented at a step 810. One advantage of the embodiment of FIG. 8 is that a user can run place and route at the HDL stage which may result in better performance. It should be noted that after the new HDL file is generated at step 808, the HDL file is synthesized at step 606 of FIG. 6, and configuration information is generate according to the remaining blocks of FIG. 6. Another advantage of the embodiment of FIG. 8 is the block sizes of the hardware modules don't need to be fixed to the size of the slots in the reference platform. The user still doesn't have to specify the static parts in the platform and the user specifies the use of the block just by making a call in their software program.

Figure 9:
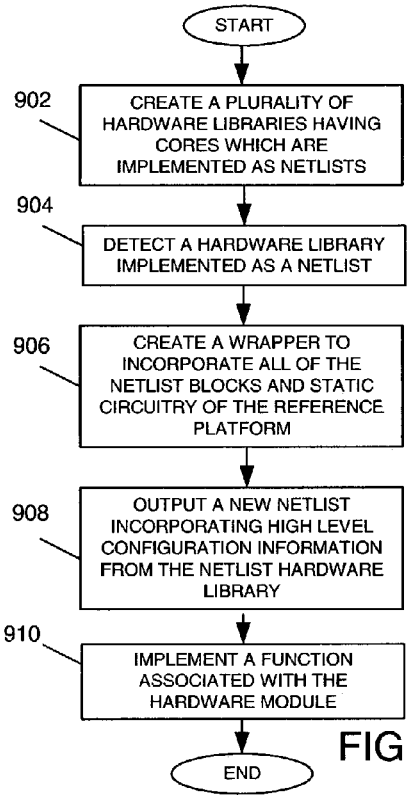
FIG. 9 a flowchart showing a method of creating a netlist file having high level configuration information of a hardware module according to an embodiment of the present invention.

Turning now to FIG. 9, a flowchart shows a method of inserting module information of a netlist hardware file in a programmable logic device according to an embodiment of the present invention. In particular, a plurality of hardware library files are created having cores which are implemented as netlists at a step 902. A hardware library implemented as a netlist is detected at a step 904. A wrapper is created to incorporate the netlist and a netlist for static circuitry of the reference platform at a step 906. A new netlist incorporating high-level configuration information from the netlist hardware library file is a output at a step 908. Finally, a function associated with a hardware module is implemented in step 910. It should also be noted that after the new netlist is generated at step 908, place and route is then performed at step 610 of FIG. 6, and configuration information is generated according to the remaining blocks of FIG. 6.

Figure 10:
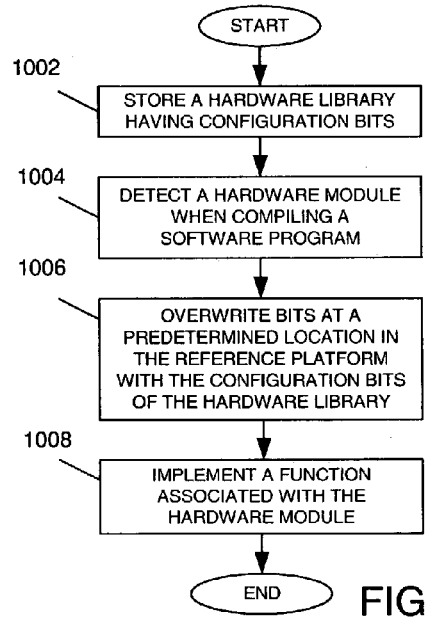
FIG. 10 a flowchart showing a method of writing configuration bits of a hardware file in a reference platform according to an embodiment of the present invention.

Turning now to FIG. 10, a flowchart shows a method of writing configuration bits of a hardware file at a bitstream level in a reference platform according to an embodiment of the present invention. In particular, a hardware library having configuration bits is stored at a step 1002. The hardware module is detected when a program is compiled for the field programmable gate array at a step 1004. The bits in a predetermined location in a reference platform are overwritten with configuration bits of the hardware library at a step 1006. A function associated with the hardware library is implemented in the step 1008.

Figure 11:
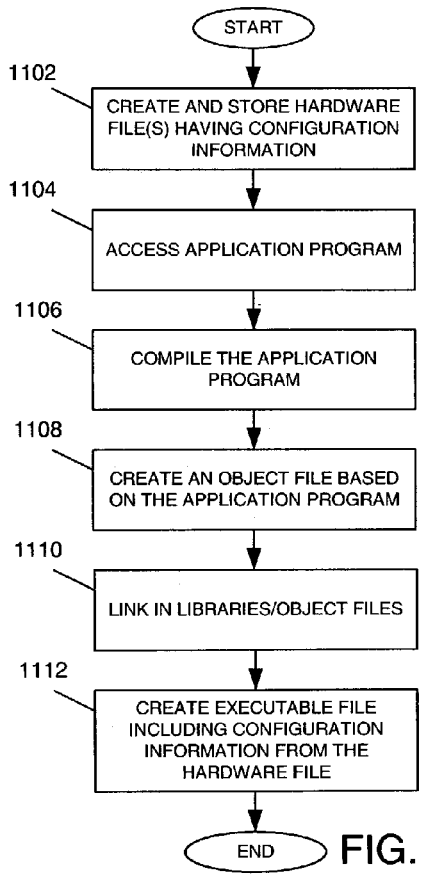
FIG. 11 a flowchart showing a method of creating an executable file including configuration information of a hardware library according to an embodiment of the present invention.

Turning now to FIG. 11, a flowchart shows a method of creating an executable file including configuration information for a hardware library according to an embodiment of the present invention. A hardware library having configuration information is created and stored at a step 1102. An application program is accessed at a step 1104. The application program is compiled at a step 1106, and an object file based on the application program is created at a step 1108. Library and object files are then linked in at a step 1110. An executable file including configuration information from a hardware file having hardware module information is created at a step 1112.

Figure 12:
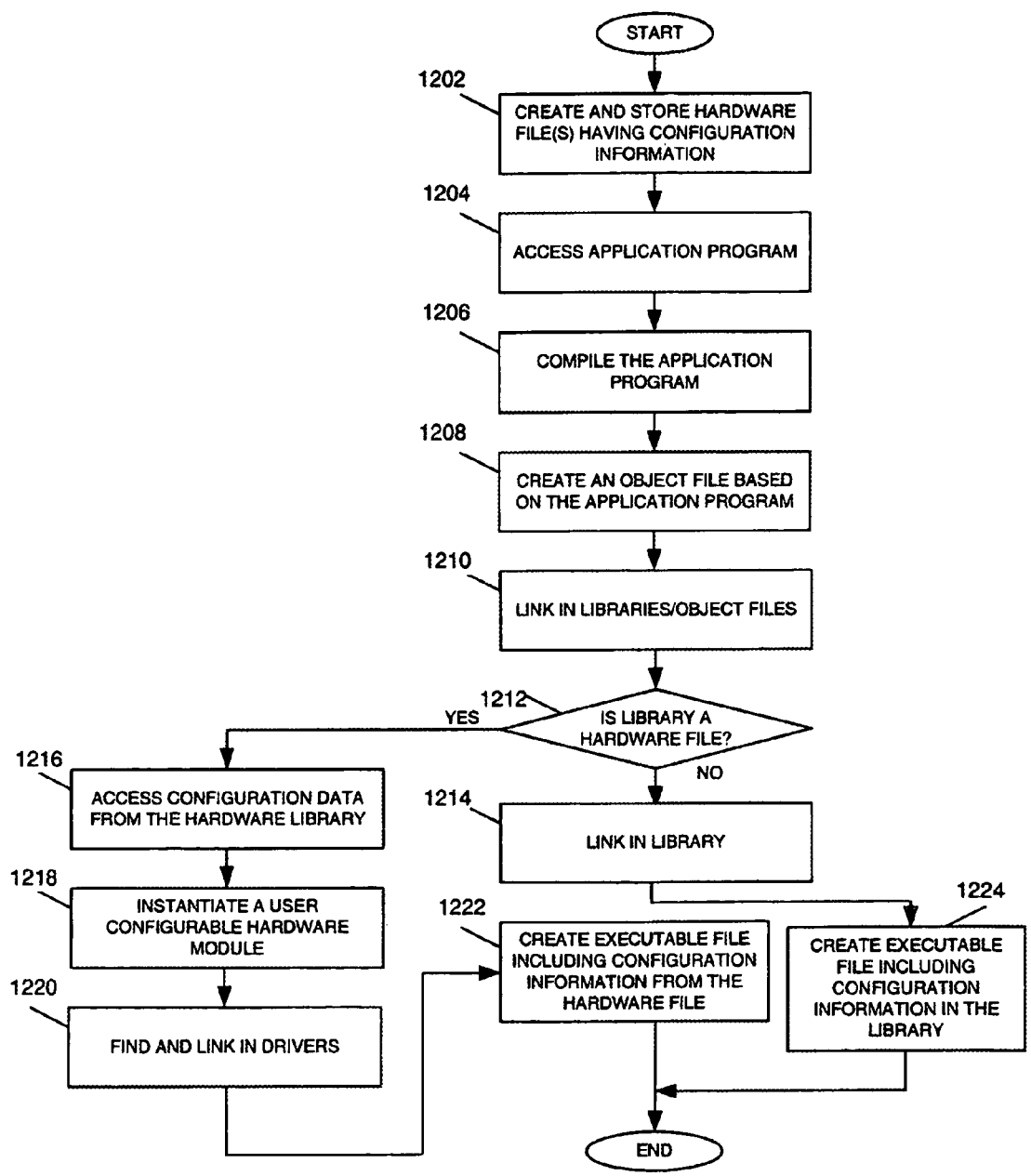
FIG. 12 a flowchart showing a method of linking hardware and software libraries according to an embodiment of the present invention.

Turning now to FIG. 12, a flowchart shows a method of using hardware modules in a programmable logic device according to an embodiment of the present invention. A hardware file having configuration information is created and stored at a step 1202. An application program is then accessed at a step 1204, and is compiled at a step 1206. An object file based on the application program is created at a step 1208. When this code gets compiled, the compiler sees that a function call is an external reference so it leaves it up to the linker. The linker will search the list of library/object files to find the function with the correct signature and it will insert the code into the executable. Libraries and object files are then linked in at a step 1210. For example, assume the application program has a function call to the "decoder( )" function. When the application program is complied, the compiler recognizes this is an external function call, hence it is left up to the linker to find a library, e.g., decoder.lib, associated with this function.

It is then determine whether a library is a hardware file at a step 1212. If the library is not a hardware library, the library is linked in as a conventional library at a step 1214 and an executable file is created including information in the library at a step 1224. If the library is a hardware library, configuration data from the hardware library is accessed at a step 1216. A user configurable hardware module is then instantiated in a step 1218. Continuing with the decoder example above, the header of decoder.lib is examined and the library type is determined to be HW. The configuration data in the library is accessed. A user defined decoder module is instantiated and inserted in an instantiation of the reference platform (see FIG. 5). Drivers for the hardware module are then found and linked in at a step 1220. Finally, an executable file including configuration information from the hardware library is created at a step 1222.

One advantage of the embodiment of FIG. 12 is that the software engineer does not need to run any of the FPGA implementation tools (e.g. place and route, etc). This results in an approach that uses just software design tools. Also it does not require the software engineer to do any routines to set up the hardware and it does not require a fixed platform for the programmer to target. Because the libraries are pre-implemented, the compilation process is extremely fast. Libraries are allowed to contain multiple hardware modules within the same library file. This situation arises when multiple modules communicate with each other and are required to be present at the same time.

In summary, this invention is a methodology to use hardware libraries. The hardware libraries are in the same format as a software library but the information is interpreted differently. Modifying a compiler will allow it to recognize the hardware libraries and to insert their configuration into the given platform. Platform independence is achieved because there is no modifications to be made to the software to target different platforms. When compiling the program, the linker would be linked against a different library. For example a platform, named A, has modules communicating over a communication bus, such as a PLB bus. However there is another platform, named B, that has modules communicating over a different communication medium such as a network. Modules that implement the function call are contained in library A and library B (which target platform A and platform B, respectively).

It can therefore be appreciated that the new and novel method and system for using a hardware library in a programmable logic device. It will be appreciated by those skilled in the art that, given the teaching herein, numerous alternatives and equivalents will be seen to exist which incorporate the disclosed invention. As a result, the invention is not to be limited by the foregoing embodiments, but only by the following claims.

What is claimed is:

1. A method of using hardware libraries in a programmable logic device, said method comprising the steps of:
    detecting an object file type field in a header of a hardware library when compiling a software program;
    accessing hardware module information stored in said hardware library; and
    inserting said hardware module information of said hardware library into a reference platform.

2. The method of claim 1 wherein said step of inserting said hardware information of said hardware library into a reference platform comprises generating an HDL file incorporating hardware module information in an HDL hardware library file.

3. The method of claim 1 wherein said step of inserting said hardware information of said hardware library into a reference platform comprises generating a netlist incorporating hardware module information in a netlist hardware library file.

4. The method of claim 1 further comprising a step of storing said hardware library in the memory of a host device incorporating said programmable logic device.

5. The method of claim 1 wherein said step of inserting said hardware module information comprises performing a bitstream manipulation to implement said hardware library as a hardware module.

6. A method of using hardware libraries in a programmable logic device, said method comprising the steps of:
    detecting an object file type field in a header of a HDL hardware library when compiling a software program;
    accessing hardware module information stored in said HDL hardware library; and inserting said hardware module information of said HDL hardware library into a reference platform.

7. The method of claim 6 further comprising a step of storing said HDL hardware library in a memory of a host device incorporating said programmable logic device.

8. The method of claim 7 wherein said step of storing a HDL hardware library comprises storing a pre-implemented library.

9. The method of claim 7 wherein said step of storing said HDL hardware library comprises storing a HDL hardware library having module information for multiple hardware modules.

10. A method of using hardware libraries with a programmable logic device, said method comprising the steps of:
   detecting an object file type field in a header of a netlist hardware library when compiling a software program;
   accessing hardware module information stored in said to netlist hardware library; and
   inserting said hardware module information of said netlist hardware library into a reference platform.

11. The method of claim 10 further comprising a step of storing a netlist hardware library in a memory of a host device incorporating said programmable logic device.

12. The method of claim 11 wherein said step of storing a netlist hardware library comprises storing pre-implemented libraries.

13. The method of claim 11 wherein said step of storing a netlist hardware library comprises storing a netlist hardware library having configuration information for multiple hardware modules.

14. The method of claim 10 further comprising a step of generating configuration information based on said netlist hardware library.

15. The method of claim 10 further comprising a step of implementing a function in said hardware module.

16. A method of using hardware libraries in a programmable logic device, said method comprising the steps of:
   storing a hardware library having hardware configuration information;
   reading an external reference incorporated when compiling a software program;
   detecting that said external reference is a hardware library type; and
   inserting said configuration information in said hardware library into a hardware module in a reference platform.

17. The method of claim 16 wherein said step of storing a hardware library having hardware configuration information comprises storing a hardware library in a memory of a host device incorporating said programmable logic device.

18. The method of claim 16 wherein said step of storing a hardware library having hardware configuration information comprises storing pre-implemented libraries.

19. The method of claim 16 wherein said step of storing a hardware library having hardware configuration information comprises storing a hardware library having configuration information for multiple hardware modules.

20. The method of claim 16 wherein said step of detecting that said external reference is a hardware library type comprises detecting an object file type field in a header of said hardware library.

21. The method of claim 16 wherein said step of inserting configuration information comprises performing a bitstream generation to place a hardware module definition contained in a hardware library into the hardware module in said reference platform.

22. A method of using hardware libraries in a programmable logic device, said method comprising the steps of:
   storing a hardware library having configuration information for a hardware module in a memory of a host device incorporating said programmable logic device;
   reading an external reference incorporated when compiling software program;
   detecting an object type field header in a header of said hardware library; and
   performing a bitstream manipulation to place a modulation definition contained in said hardware library into the hardware module in a reference platform.

* * * * *